(12) United States Patent
Shih et al.

(10) Patent No.: US 7,582,557 B2
(45) Date of Patent: Sep. 1, 2009

(54) PROCESS FOR LOW RESISTANCE METAL CAP

(75) Inventors: Chien-Hsueh Shih, Taipei (TW); Chen Hua Yu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 259 days.

(21) Appl. No.: 11/331,552

(22) Filed: Jan. 13, 2006

(65) Prior Publication Data

US 2007/0082473 A1  Apr. 12, 2007

Related U.S. Application Data

(60) Provisional application No. 60/724,953, filed on Oct. 6, 2005.

(51) Int. Cl.
H01L 21/44 (2006.01)
(52) U.S. Cl. .............. 438/627; 438/637; 438/643; 438/653; 438/656; 438/677; 257/E21.17; 257/E21.168; 257/E21.587
(58) Field of Classification Search ................ 438/597, 438/513, 788, 627, 637, 643, 653, 656, 677; 257/E21.17, E21.168, E21.587
See application file for complete search history.

(56) References Cited

U.S. PATENT DOCUMENTS

| 5,749,975 | A | 5/1998 | Li et al. |
| 5,980,977 | A | 11/1999 | Deng et al. |
| 6,022,669 | A * | 2/2000 | Uchida et al. ............... 430/313 |
| 6,204,192 | B1 | 3/2001 | Zhao et al. |
| 6,207,553 | B1 | 3/2001 | Buynoski et al. |
| 6,218,303 | B1 | 4/2001 | Lin |
| 6,475,902 | B1 | 11/2002 | Hausmann et al. |
| 6,495,453 | B1 | 12/2002 | Brongersma et al. |
| 6,528,409 | B1 | 3/2003 | Lopatin et al. |
| 6,613,697 | B1 * | 9/2003 | Faur et al. ................... 438/770 |
| 6,656,832 | B1 | 12/2003 | Pan et al. |
| 6,713,377 | B2 | 3/2004 | Lee et al. |
| 6,743,473 | B1 | 6/2004 | Parkhe et al. |
| 6,815,332 | B2 * | 11/2004 | San et al. .................... 438/623 |
| 6,844,258 | B1 * | 1/2005 | Fair et al. .................... 438/648 |
| 2002/0036452 | A1 * | 3/2002 | Muroyama et al. .......... 313/310 |
| 2004/0087149 | A1 * | 5/2004 | Tessmer et al. .............. 438/687 |
| 2004/0126713 | A1 | 7/2004 | Shiraishi et al. |
| 2004/0211357 | A1 | 10/2004 | Gadgil et al. |
| 2004/0214424 | A1 | 10/2004 | Chuang |
| 2005/0009325 | A1 | 1/2005 | Chung et al. |
| 2005/0023698 | A1 | 2/2005 | Lee |
| 2005/0029662 | A1 * | 2/2005 | Nakano et al. ............... 257/758 |
| 2005/0095830 | A1 * | 5/2005 | Weidman et al. ............ 438/584 |

(Continued)

FOREIGN PATENT DOCUMENTS

CN  1449015  10/2003

(Continued)

OTHER PUBLICATIONS

Research Intelligence: Novel cluster tool at http://www.liv.ac.uk/researchintelligence/issue1/cluster.html, 1999, 3 pages.

(Continued)

*Primary Examiner*—Alexander G Ghyka
*Assistant Examiner*—Seahvosh J Nikmanesh
(74) *Attorney, Agent, or Firm*—Duane Morris LLP; Steven E. Koffs

(57) ABSTRACT

An exemplary method includes: providing a substrate with exposed metal and dielectric surfaces, performing a reducing process on the metal and dielectric surfaces, and transferring the substrate in an inert or reducing ambient to a chamber for that is used for selective metal layer deposition.

19 Claims, 4 Drawing Sheets

U.S. PATENT DOCUMENTS

| | | |
|---|---|---|
| 2005/0194255 A1 | 9/2005 | Tiwari |
| 2006/0003570 A1* | 1/2006 | Shanmugasundram et al. .................. 438/618 |
| 2007/0037389 A1 | 2/2007 | Chen et al. |
| 2007/0082473 A1 | 4/2007 | Shih et al. |

FOREIGN PATENT DOCUMENTS

| | | |
|---|---|---|
| CN | 1536645 | 10/2004 |
| JP | 11016912 | 1/1999 |
| JP | 2002151518 | 5/2002 |
| JP | 2003243499 | 8/2003 |
| JP | 2005116630 | 4/2005 |
| KR | 20010067081 A | 7/2001 |

OTHER PUBLICATIONS

Micro: Reality Check at http://www.micromagazine.com/archive/04/04/reality.html, 2003, 4 pages.

Electronic News—The Fab Line—Jun. 25, 2001—Electronic News—CA90465, at http://www.reed-electronics.com/electronicnews/article/CA90465, html; 4 pages.

CVD Equipment Corporation at http://www.cvdequipment.com/furnaces.htm, Sep. 29, 2005, 3 pages.

Lee et al., "Evolution of PVD-deposited Cu alloys for interconnect applications", Advances in Electronics Manufacturing Technology, V-EMT 1:16 (Jul. 12, 2004), 4 pages.

Polution Prevention in the Plating Process, Metal Finishing Industry at http://www.p2pays.org/ref/03/02454/plating.htm, Sep. 27, 2005, 73 pages.

Xing Chen et al, Semiconductor Magazine, CVD: Cleaning, Advances in Remote Plasma Sources For Cleaning 300 mm and Flat Panel CVD Systems, Aug. 2003, 6 pages.

Shenzhen Goldenhouse Vacuum Technology Co., Ltd. at http://www.china-goldenhouse.cn/news/en/news_detail.asp?id=133, Sep. 27, 2005, 1 page.

Corresponding Japanese 2006270542-Translation of Notice of Rejection Mar. 10, 2009.

Corresponding Korean 1020060091477-Translation of Office Action Aug. 23, 2007.

* cited by examiner

PROCESS FOR LOW RESISTANCE METAL CAP

This application claims the benefit of U.S. Provisional Patent Application No. 60/724,953, filed Oct. 6, 2005, which is expressly incorporated by reference herein in its entirety.

FIELD OF THE INVENTION

The present invention relates to semiconductor fabrication generally, and more specifically to a method for forming a metal cap layer on a metal line.

BACKGROUND

In a semiconductor integrated circuit (IC) fabrication process, the back end of line (BEOL) processing results in a plurality of interconnects comprising alternating metal (e.g., copper) and inter-layer dielectric (ILD) layers, with vias through the ILD layers connecting the metal layers. In determining the performance of a BEOL processing technology, a variety of criteria are used, including the maximum current density (Jmax), the line resistance $R_S$, and the stress migration (SM). As semiconductor IC technology migrates from 90 nanometer technology to smaller feature sizes, the desired maximum current density Jmax increases. Therefore, a method to improve the electromigration (EM) is desired.

A metal cap layer can be selectively deposited over the exposed metal surfaces. It has been demonstrated that a tenfold improvement of electromigration (EM) performance in the (VxMx, VxMx+1) interconnect can be obtained by selective use of the metal cap on copper lines. One approach includes deposition of a cobalt cap.

After chemical mechanical polishing (CMP), the cap layer is selectively applied over the metal lines, but not over the dielectric. After CMP, there is copper oxide on top of the copper line, some post CMP residue on the dielectric, and/or organic contamination from the CMP on both the dielectric and the copper surface. To uniformly deposit a selective metal cap layer on the Cu surface, the Cu oxide must be removed. A pre-clean step has been used to remove the copper oxide. One conventional method includes a wet clean process of immersing the wafer in an acidic solution to dissolve Cu oxide. For example, to achieve high selectivity performance (to avoid leakage), a wet clean solution, including $H_2SO_4$, Citric Acid and a wetting agent, has been applied to the substrate having exposed metal and dielectric surfaces. The $H_2SO_4$, Citric Acid and wetting agent remove metal oxide on the metal surface, metal residue on the dielectric surface, and organic residues on both the metal and dielectric surfaces.

However, during Cu oxide removal by the above-described acidic solution, a recess is created, which results in an increase in line resistance. For example, in some cases, after the metal oxide has been removed, a 3% to 5% increase in line resistance $R_s$ has been observed. For example, the line resistance increase for a process including deposition of a cobalt cap has been measured at about 2.4%. An increase in $R_S$ degrades RC signal delay performance. Also, because the Cu oxide formation can be pattern dependent, differences in the depths of the Cu recess occur on dense and iso pattern areas, resulting in non-uniform metal cap deposition.

DETAILED DESCRIPTION

Figure 1:
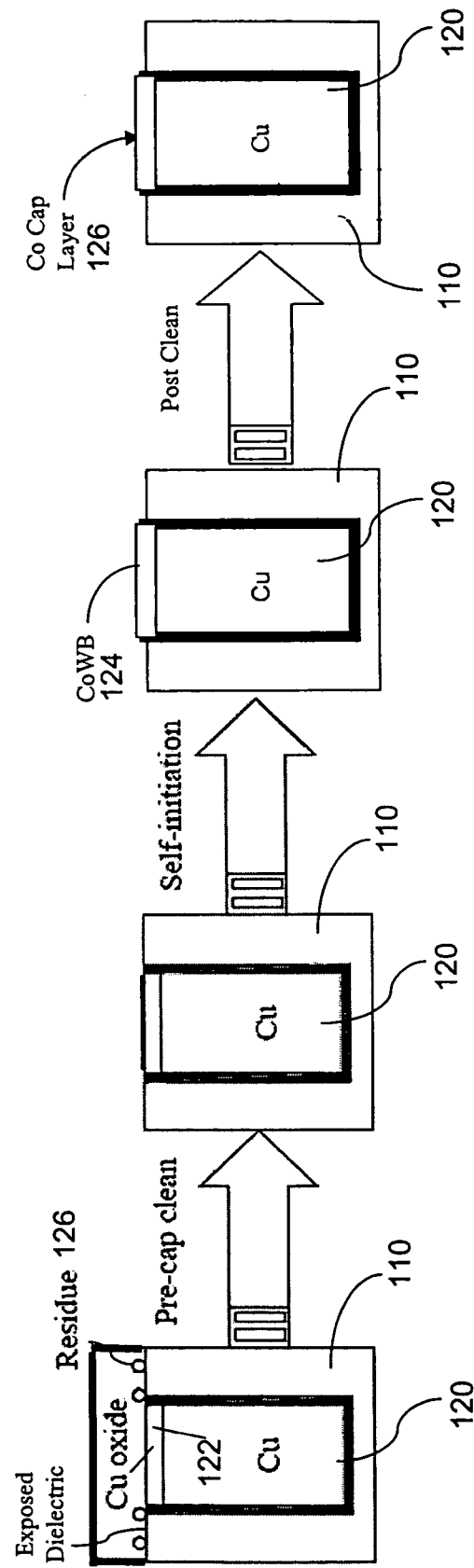
FIG. 1 is a diagram showing an exemplary process for electroless deposition of a cap layer above a metal layer on a substrate.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 4:
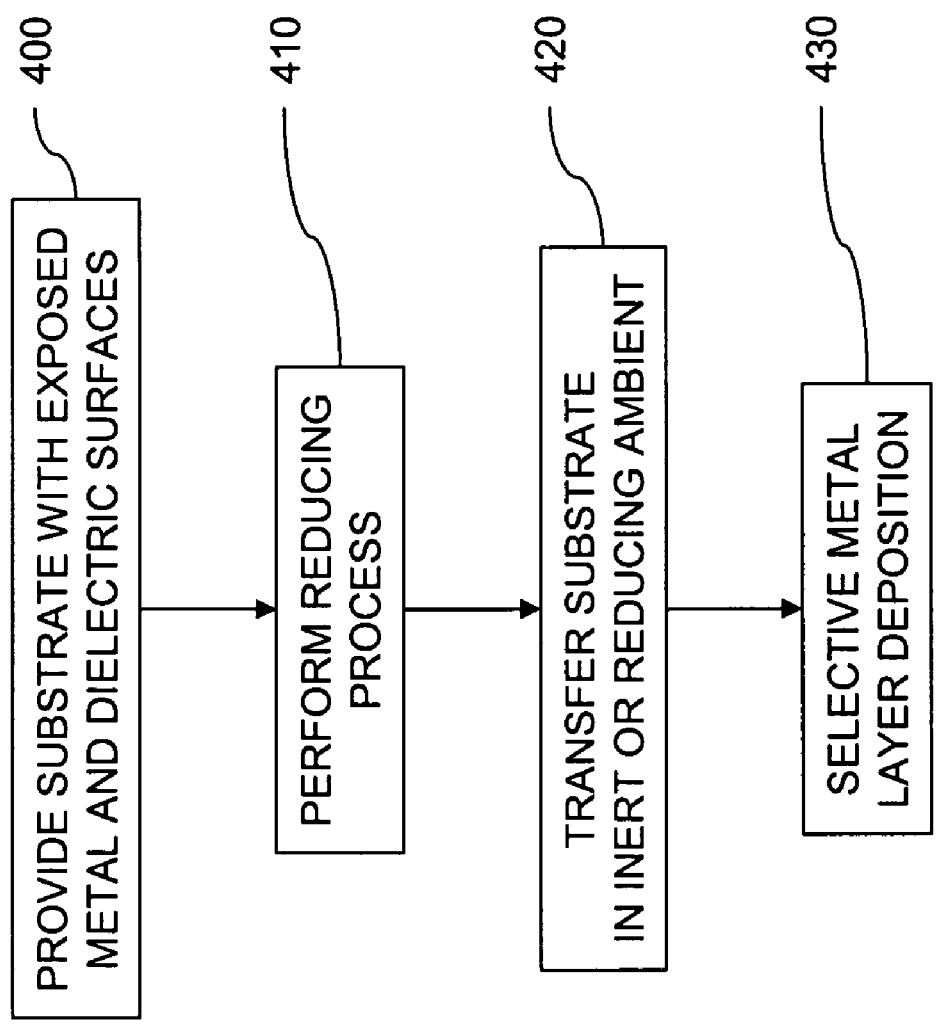
FIG. 4 is a flow chart diagram of one embodiment of the invention.

A process described below enables cleaning the metal oxide on the exposed metal surface, the metal residue on the exposed dielectric surface, and the organic residues on both the metal and dielectric surface, with little or no increase in the line resistance $R_s$. FIG. 1 is a diagram showing the process and the changes to the structure that occur during the process. FIG. 4 is a flow chart diagram of an exemplary process.

At step 400 (FIG. 4) a substrate 110 is provided with exposed metal and dielectric surfaces. The exposed metal may be a copper line 120, and may have an oxide layer 122 at its exposed surface. The exposed dielectric of substrate 110 may have a residue 126 thereon.

At step 410, a reducing process is performed on the metal surface 122 and dielectric surface 110. The oxide 122 and residue 126 are removed.

At step 420 the substrate 110 is transferred in an inert or reducing ambient to a chamber (not shown) that is used for selective metal layer deposition.

At step 430, the selective metal layer deposition is performed, to form the metal layer 124.

Figure 5:
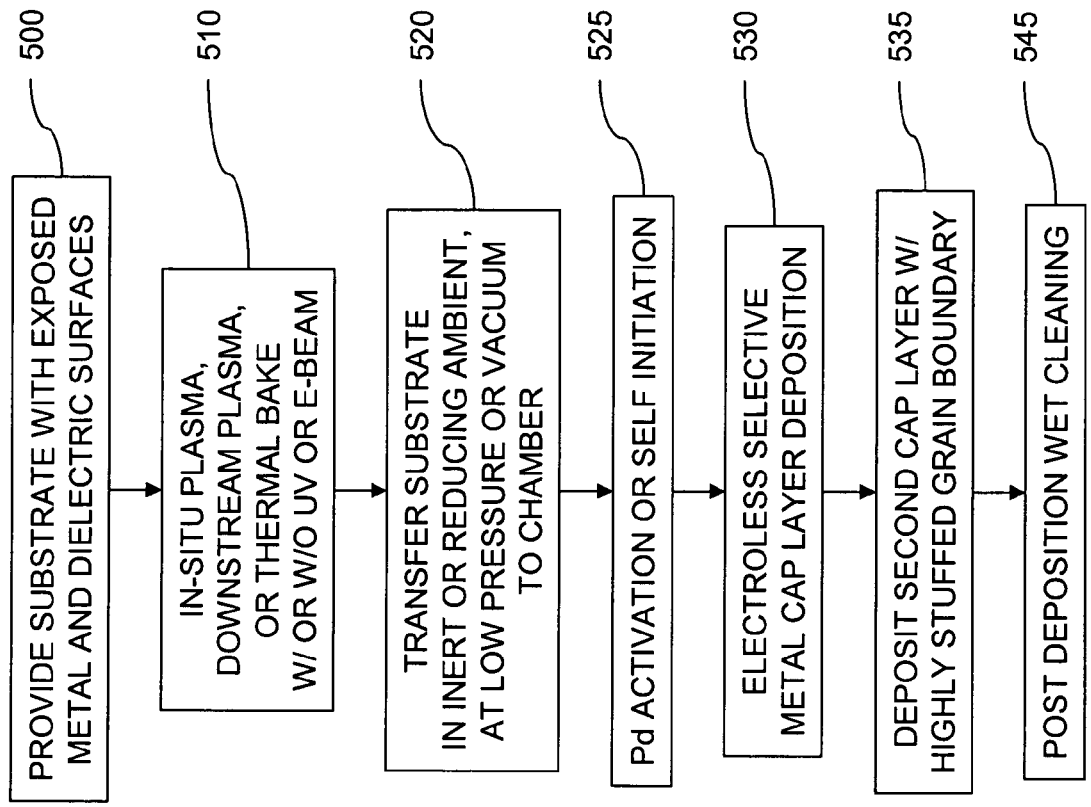
FIG. 5 is a flow chart diagram of another embodiment of the invention.

FIG. 5 is a flow chart diagram showing one embodiment of the invention.

At step 500 a substrate 110 is provided with exposed metal and dielectric surfaces.

At step 510, a reducing process is performed on the metal surface 122 and dielectric surface 110. Preferably, the reducing process is a dry process performed in a dry and vacuum chamber. In some embodiments, the reducing process includes exposing the substrate to an in-situ plasma or a downstream plasma. A plasma that has $H_2$ or forming gas reduces the copper oxide, without dissolving the copper. Thus, the recess observed in the wet pre-clean process is avoided. A downstream plasma is preferred because it avoids plasma induced damage to the substrate.

In other embodiments, the reducing process includes a thermal bake in $H_2$ or a forming gas (including $H_2$ and $N_2$). An exemplary thermal baking step may be performed at a temperature from about 100 degrees C. to about 400 degrees C. In some embodiments, the temperature is about 200 degrees C.

If a thermal baking step is used, the substrate may optionally be exposed to an ultra-violet (UV) or electron beam (e-beam).

At step 520, the substrate 110 is transferred to a chamber in an inert gas (e.g., a noble gas or nitrogen) or a reducing ambient to perform electroless metal cap layer deposition without a wet pre-clean step. In some embodiments, the substrate is placed in an intermediate chamber between the dry clean process and the wet cap deposition process. This prevents the copper oxide from re-forming on the lines.

In some embodiments, the intermediate chamber is a vacuum or low pressure chamber that is separate from the chamber in which the dry clean process is performed, and separate from the chamber in which the wet deposition process is performed.

In some embodiments, the dry clean process, the intermediate transfer and the wet deposition are all performed in a cluster tool, and the intermediate chamber is included within the cluster tool.

At step 525, to make sure that the Cobalt is selectively deposited on copper, and not on the dielectric, a step is performed, in between the surface cleaning and the deposition. Once the substrate has been transferred to the chamber for cap deposition, an activation or initiation step is performed. In some embodiments, the activation or initiation step is a palladium (Pd) activation or Pd initiation. In other embodiments, a step is performed to initiate or activate the copper surface, referred to as the self initiation process.

Both of the initiation processes involve an electroless process in a solution that is different from the solution used to deposit the cobalt cap. Table 1 lists a variety of solutions that can be used for the self activation and Pd activation processes, before depositing a cobalt cap on copper lines. In Table 1, "DMAB" denotes "Dimethylamine Borane."

tion process allows the Cobalt deposition process to be used to provide the minimum $R_s$, because no Pd layer forms on the copper. With self-initiation process, it's possible to provide a cobalt cap having an $R_s$ increase of about 2% to about 2.4% greater than the Cu line with no cap.

At step 530, after the self activation or Pd activation, a selective electroless metal cap layer deposition process is performed.

U.S. Pat. Nos. 6,495,453, 6,713,377, 6,207,553 and 6,204,192 are incorporated by reference herein in their entireties. These patents teach a variety of electroless deposition techniques.

In some embodiments, the cap material deposited on the copper is an alloy of cobalt tungsten and boron. In other embodiments, the cap material deposited on the copper is an alloy of cobalt, tungsten, boron and phosphorus. Many other cobalt alloys may be used. Preferably, the cap alloy comprises more than 80% cobalt. In some embodiments, the electroless deposition is performed at a temperature of about 65 degrees C. to about 95 degrees C.

Different electroless solution compositions are used to provide the cobalt alloy cap, depending on whether the copper is self-activated or Pd activated. For the palladium initiation a preferred reducing agent includes phosphorous (e.g., $NaH_2PO_2 \cdot 2 H_2O$), and the alloy of the cap may be a Co(P) alloy, a Co(W,P) alloy, or a Co(Mo,P) alloy. Boron is the most used element for the self activation process. The reducing agent for the self-activation can include boron (e.g., $NaBH_4$, $(CH_3)_2NHBH_3$ (DMAB)) or phosphorous (e.g., $NaH_2PO_2 \cdot 2$

TABLE 1

| Selective Co Based Capping Layer Deposition | | Co Based, Pd Activated | | | Co Based, Non-Pd Activated | | | | |
|---|---|---|---|---|---|---|---|---|---|
| Function | Component (example) | Co(P) | Co(W, P) | Co(Mo, P) | Co(B) | Co(P, B) | Co(W, B) | Co(Mo, B) | Co(W, P, B) | Co(Mo, P, B) |
| Source of Co | Co Salt, CoCl2 or CoSO4 | v | V | v | v | v | v | v | v | v |
| Source of M2 (W or Mo) | (NH4)2WO4, Na2WO4, H3[P(W3O10)4] | | V | | | | v | | v | |
| | (NH4)2MoO4, Na2MoO4, | | | v | | | | v | | v |
| Reduction Agent and source of N (P or B) | NaH2PO2•2H2O | v | V | v | | v | | | v | v |
| | NaBH4, (CH3)2NHBH3(DMAB) | | | | v | v | v | v | v | v |
| Surface Activation | Pd—Cu displacement dep | | v | | | | option | | | |
| | Chemical Grafting + Pd ions adsorption | | v | | | | | | | |
| | Chemical Grafting only (non-Pd appraoch) | | v | | | | | | | |
| Complex Agent | Na3C6H5O7•2H2O | | v | | | | v | | | |
| Stabilizer | Pyridine, Citric Acid, CrCl3 | | option | | | | v | | | |
| PH | 8.5-10 | | v | | | | v | | | |
| Dep. Temperature | 70-80° C. | | v | | | | v | | | |
| Bath Stability | | | long | | | | short | | | |

For the Pd activation process, one of the following processes is used: Pd—Cu displacement deposition or Chemical Grafting with Pd ions adsorption. Chemical grafting is a process of attachment of a low molecular weight active group (monomer) to a parent polymer or membrane. Either bulk polymer or surface modification is possible.

In the Pd initiation process the Cobalt electroless solutions could grow on the copper. If palladium initiation is used, that palladium layer would form a copper alloy, which would cause further $R_s$ increase.

The self initiation process involves use of an electroless cobalt solution, having a composition to make the copper surface active enough to act as a catalyst surface, to reduce the cobalt (i.e., to grow the cobalt on the copper). The self initia- $H_2O$), and alloy of the cap may be a Co(B) alloy, a Co(P,B) alloy, a Co(W,B) alloy, a Co(Mo,B) alloy, a Co(W,P,B) alloy or a Co(Mo,P,B) alloy.

In performing the electroless deposition, desired properties for a top passivation layer on Cu are different from a layer that is optimized to be deposited below a dielectric for interfacing between the copper and the dielectric. For the interface between the Cu and the cap, a pure metal contact with the Cu is used to provide a good interface and strong bonding. For the interface between the Cu and the ILD above the Cu, grain boundary stuffing is advantageous to enhance the barrier property of the cap.

Figure 2:
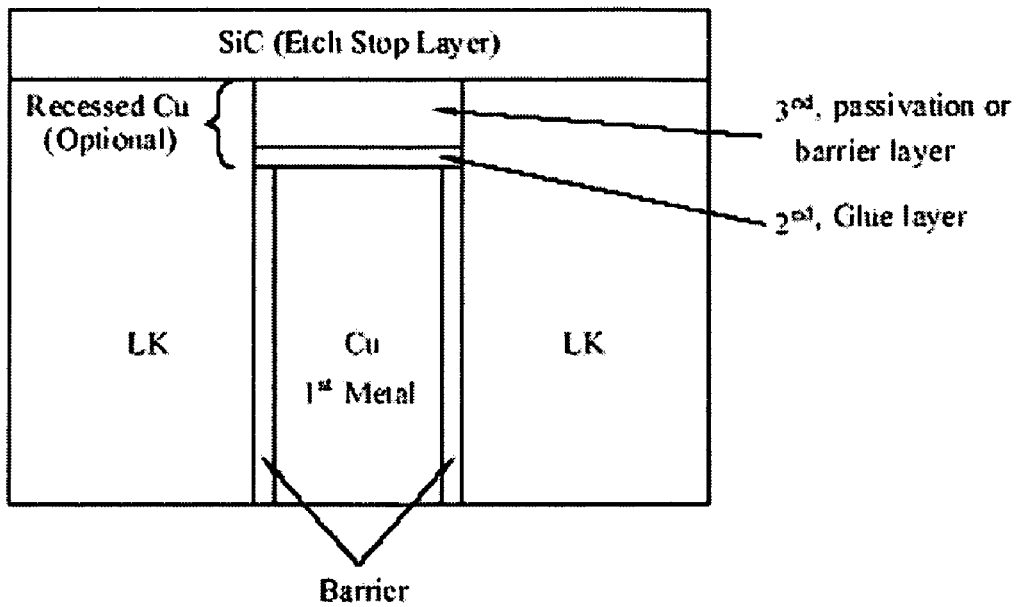
FIG. 2 is a diagram showing a substrate with an exemplary cap layer having a glue layer and a barrier (passivation) layer.

At step 535, an optional second cap layer is deposited. FIG. 2 shows an advantageous cap layer provided by: depositing a first layer of near pure metal on the Cu interface; and depositing a second layer as a cap, where the second layer has a highly stuffed grain boundary for good barrier properties, low $R_s$, and for prevention of plasma damage etching damage, oxidation and Cu diffusion. Thus, the resulting interconnect comprises the first metal layer (e.g., copper), and a cap comprising second and third metal layers. The second metal layer is formed over the first metal layer as a glue layer, and a third metal layer formed over second metal layer as a passivation layer or barrier layer. The second metal layer may include at least about 95 atom % Co or Ni, and the third metal layer may include at most about 95 atom % Co or Ni. In the second and third metal layers, the alloying element includes one or more of the following elements: W, P, Mo, Re, and/or B.

In one embodiment, the second metal layer is deposited using one chemical, and the third metal layer is deposited by simultaneously changing one or more process parameters. The process parameter that is varied may be, for example, the spin rate (rpm), the flow rate, the chemical concentration, or the temperature of the electroless deposition solution, or a combination of these paramters. For example, in one embodiment, a low temperature liquid is provided on a hot substrate; this creates a multilayer film structure for the beginning and later part of the resulting barrier.

At step 545, after the electroless deposition, a wet post-deposition cleaning is performed to remove residue particles, for example, using a scrub clean to scrub down the particles.

Advantageously, the resulting structure can exhibit less than a 1% $R_s$ increase relative to a substrate formed by a process in which there is no wet or dry pre-deposition cleaning step.

EXAMPLE

Figure 3:
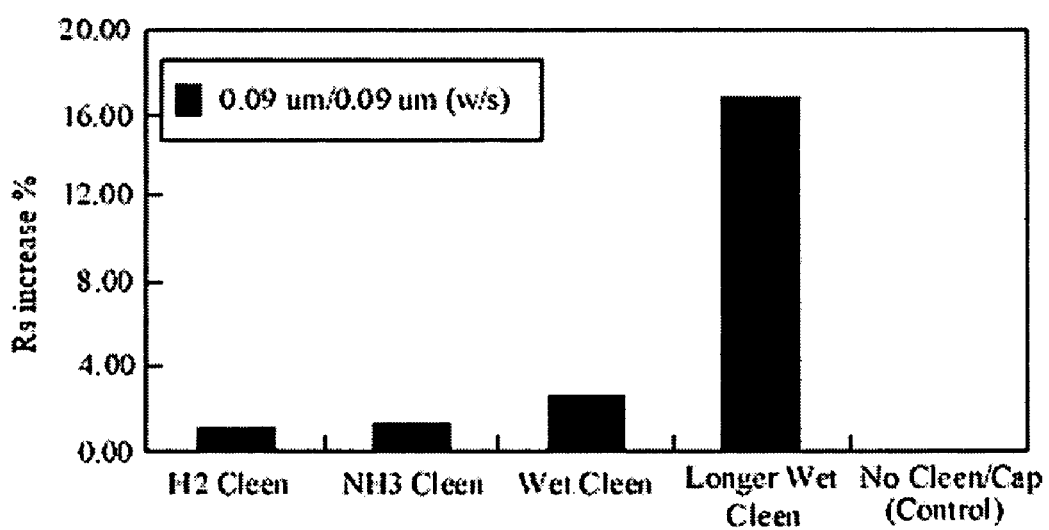
FIG. 3 is a histogram comparing the line resistance increase for five variations on a cap deposition process.

Samples were tested in a PVD chamber for the process, comparing the line resistance achieved with different pre-deposition cleaning steps. FIG. 3 is a histogram of the data collected.

All of the samples included a cobalt cap layer. The control sample (labeled "no clean/cap") was fabricated without performing a wet or dry pre-deposition cleaning step. The line resistance of this sample serves as a baseline, against which the line resistance of the other samples are compared. (Although the line resistance of the control sample is better than the other samples, the control sample had a less favorable stress migration performance. Thus, the method disclosed herein is viable compared to the control sample, when the other characteristics Jmax and SM are considered.). The bar labeled "wet clean" represents the prior art wet cleaning acidic solution, having an $R_s$ that is about 2.4% greater than that of the control sample. The bar labeled, "longer wet clean" used a similar process to the "wet clean" bar, with a longer process time, and an even larger increase in $R_s$.

The sample using the dry $H_2$ plasma cleaning before cap deposition had an $R_s$ increase of less than 1% (about 0.8%) above the control sample. The sample using the $NH_3$ plasma cleaning before cap deposition had an $R_s$ increase of about 1% above the control sample.

Thus, the method described above can provide a metal cap layer with less than a 1% increase in line resistance relative the sample formed without pre-cleaning. No selectivity is lost, whether the dielectric is of a low K type (e.g., dielectric constant about 2.6) or extra low K type (e.g., dielectric constant of 2.5 or less). The EM performance for both via and trench shows more than a 10× improvement compared to the method without forming the cap over the metal.

Various embodiments of fabrication methods according to embodiments of the invention are described above. The invention also encompasses a product made by any of the methods described above.

Although an example is described including a copper metal layer and a cobalt alloy cap, the method described above can be applied to substrates having other types of metal layers thereon, with corresponding compatible cap layers.

Although the invention has been described in terms of exemplary embodiments, it is not limited thereto. Rather, the invention should be construed broadly, to include other variants and embodiments, which may be made by those skilled in the art without departing from the scope and range of equivalents of the invention.

What is claimed is:

1. A method comprising the steps of:
providing a substrate with exposed metal and dielectric surfaces:
performing a reducing process on the metal and dielectric surfaces; and
transferring the substrate in an inert or reducing ambient to a chamber that is used for selective metal layer deposition,
wherein the reducing process includes exposing the substrate to a downstream plasma.

2. The method of claim 1, wherein the plasma comprises $H_2$ ions or a forming gas.

3. The method of claim 1, wherein the selective metal deposition includes deposition of at least one layer of a cobalt alloy.

4. The method of claim 1, wherein the reducing process is performed before the transferring step, and the method further comprises performing the selective metal layer deposition after the transferring step.

5. The method of claim 1, wherein the transferring step is performed in a reducing ambient.

6. A method comprising the steps of:
providing a substrate with exposed metal and dielectric surfaces;
performing a reducing plasma process on the metal and dielectric surfaces; and
transferring the substrate in an inert or reducing ambient to a chamber that is used for selective metal layer deposition,
wherein the selective metal deposition includes deposition of at least one layer of a cobalt alloy, and the at least one layer of cobalt alloy includes:
a first layer of an alloy comprising at least about 95 atom % cobalt; and
a second layer of an alloy comprising at most about 95 atom % cobalt.

7. The method of claim 6, wherein the reducing process includes exposing the substrate to an in-situ plasma.

8. The method of claim 6, wherein the cobalt alloy includes at least one of the group consisting of B, P, W, and Mo.

9. The method of claim 6, wherein grain boundary stuffing is used in depositing the second layer.

10. The method of claim 6, wherein the first layer is deposited using a process parameter from the group consisting of a spin rate, a flow rate, a chemical concentration, or a temperature of the electroless deposition solution, wherein the second layer is deposited using a different value of the process parameter.

11. The method of claim 10, wherein the electroless deposition includes exposing the substrate to a reducing agent from the group consisting of $NaBH_4$, $(CH_3)_2 NHBH_3$ and $NaH_2PO_2$.

12. The method of claim 6, wherein the selective metal layer deposition is performed by electroless deposition.

13. The method of claim 6, wherein a metal activation step is performed before the selective metal layer deposition.

14. The method of claim 13, wherein the metal activation step is a self activation step.

15. The method of claim 13, wherein the metal activation step is a palladium activation step.

16. A substrate processed by a method comprising the steps of
   providing a substrate with exposed metal and dielectric surfaces;
   performing a reducing plasma process on the metal and; dielectric surfaces; and
   transferring the substrate in an inert or reducing ambient to a chamber that is used for selective metal layer deposition,
   wherein the selective metal deposition includes deposition of at least ne layer of a cobalt alloy that includes:
      a first layer of an ahoy comprising at least about 95 atom % cobalt; and
      a second layer of an alloy comprising at most about 95 atom % cobalt.

17. The substrate of claim 16, wherein the reducing process includes exposing the substrate to a downstream plasma.

18. A method comprising the steps of:
   providing a substrate with exposed metal and dielectric surfaces;
   performing a reducing plasma process on the metal and dielectric surfaces, the reducing plasma process including exposing the substrate to a downstream plasma comprising $H_2$ ions or a forming gas;
   transferring the substrate in a, reducing ambient to a chamber after the reducing plasma process;
   performing a selective metal deposition in the chamber alter the transferring step, the selective metal deposition including deposition of at least one layer of a cobalt alloy.

19. The method of claim 18, wherein the cobalt alloy includes at least one of the group consisting of B, P, W, and Mo, and the at least one layer of cobalt alloy includes:
   a first layer of an alloy comprising at least about 95 atom.% cobalt; and
   a second layer of an alloy comprising at most about 95 atom % cobalt wherein grain boundary stuffing is used in depositing the second layer.

* * * * *

UNITED STATES PATENT AND TRADEMARK OFFICE
CERTIFICATE OF CORRECTION

PATENT NO. : 7,582,557 B2  Page 1 of 1
APPLICATION NO. : 11/331552
DATED : September 1, 2009
INVENTOR(S) : Chien-Hsueh Shih and Chen Hua Yu It is certified that error appears in the above-identified patent and that said Letters Patent is hereby corrected as shown below:

Column 7, Claim 16, line 20, delete "ne" and insert -- one --.

Column 7, Claim 16, line 21, delete "ahoy" and insert -- alloy --.

Column 8, Claim 18, line 10, delete "," after "a".

Column 8, Claim 18, line 13, delete "alter" and insert -- after --.

Column 8, Claim 18, line 19, delete "." after "atom".

Signed and Sealed this

Sixth Day of April, 2010

David J. Kappos
*Director of the United States Patent and Trademark Office*